United States Patent [19]

Bergman et al.

[11] Patent Number: 4,973,907
[45] Date of Patent: Nov. 27, 1990

[54] RF COIL SYSTEM HAVING SEVERAL SURFACE COILS

[75] Inventors: Anthonie H. Bergman, Eindhoven, Netherlands; Eddy B. Boskamp, Shelton, Conn.

[73] Assignee: U.S. Philips Corporation, New York, N.Y.

[21] Appl. No.: 361,209

[22] Filed: Jun. 5, 1989

[30] Foreign Application Priority Data

Dec. 1, 1988 [NL] Netherlands .......................... 8802959

[51] Int. Cl.$^5$ ............................................ G01R 33/30
[52] U.S. Cl. ................................................. 324/318
[58] Field of Search ............... 324/307, 308, 318, 322; 128/653 SC

[56] References Cited

U.S. PATENT DOCUMENTS

| | | | |
|---|---|---|---|
| 4,636,730 | 1/1987 | Bottomley | 324/322 |
| 4,652,827 | 3/1987 | Eguchi et al. | 324/322 |
| 4,718,431 | 1/1988 | Hartl et al. | 324/308 |
| 4,825,162 | 4/1989 | Roemer et al. | 324/318 |
| 4,859,947 | 8/1989 | Boskamp | 324/318 |

FOREIGN PATENT DOCUMENTS 2157832  10/1985  United Kingdom ................ 324/308

Primary Examiner—Jerry W. Myracle
Assistant Examiner—Kevin D. O'Shea
Attorney, Agent, or Firm—William Squire

[57] ABSTRACT

An Rf coil system for the detection of MR resonance signals is constructed from a first system of coils for making an overall picture and a second coil system which covers substantially the same area, consists of several coils and for local imaging having a higher resolving power. In particular the latter coils preferably include magnetic resonance sensitive material which become visible on an image formed from detected MR resonance signals for indicating the position of each coil.

16 Claims, 1 Drawing Sheet

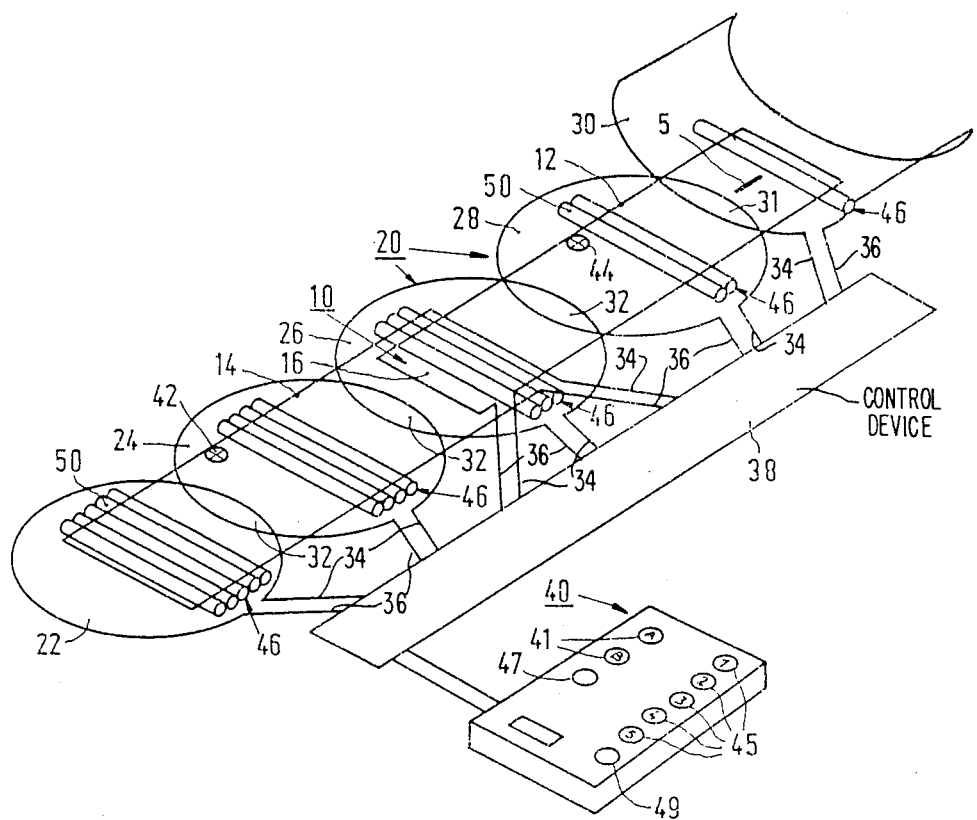

RF COIL SYSTEM HAVING SEVERAL SURFACE COILS

BACKGROUND OF THE INVENTION

The invention relates to an Rf coil system for detection of magnetic resonance signals to be generated in an object to be examined, which coil system comprises several surface coils.

Such a coil system is known from EP-A-0 273 484 corresponding to commonly owned U.S. patent application Ser. No. 117,003, filed Nov. 4, 1987, which is hereby incorporated herein by reference. A restriction experienced in known coil system is that, in particular for elongate objects, a picture consisting of several sub-pictures has to be composed or a comparatively bad signal-to-noise ratio has to be accepted.

SUMMARY OF THE INVENTION

It is the object of the invention to remove the restriction and for that purpose a coil system mentioned in the opening paragraph is characterized according to the invention in that it is constructed from at least two sets of adjoining surface coils stacked one on top of the other.

Since an Rf coil system according to the invention comprises two or more coil systems stacked one on top of the other, both an overall Picture of a comparatively large, in Particular elongate, object and sub-pictures of sub-objects situated therewithin may be formed upon detection resulting in a significantly improved signal-to-noise ratio for the latter.

In a preferred embodiment the two coil systems each consist of a cascade stack of surface coils in which a first system, for example, comprises a few, at least two, elongate substantially rectangular coils and a second system is constructed from several, for example five, substantially circular coils. The coils of each of the coil systems are preferably stacked with such a mutual overlap that the systems each individually show a minimum mutual coupling as a result of the geometry. The coils may be uncoupled against disturbances of transmitter fields by using, for example, a PIN-diode uncoupling as described in a U.S. patent application Ser. No. 339,030 filed Apr. 14, 1989 entitled "Magnetic Resonance Apparatus with Uncoupled RF Coils" in the name of Boskamp et al as a continuation-in-part of said U.S. Ser. No. 117,003, which is also hereby incorporated herein by reference.

In a further Preferred embodiment at least one of the coils of, in particular the second coil system is mounted so as to be deformable adjoining the shape of an object to be measured, for example, the neck.

In a further Preferred embodiment a mark is associated with each of the coils of one or more of the coil sYstems as a result of which a direct correlation between the coil and an image to be formed therewith is given In particular the marks are correlated with a selection switch as a result of which each of the coils individually or in combination may be selected for display. As a result of this, alpha numerical marks are particularly suitable The marks are formed in particular by small tubes filled with a liquid, for example, parafinium, subligidum, or cylinders of a suitable material which in sagittal display appear in the picture as small dots.

BRIEF DESCRIPTION OF THE DRAWING

A few preferred embodiments according to the invention will now be described in greater detail with reference to the drawing, wherein:

The sole Figure of the drawing is an isometric representation of the rf coil system of the invention.

DETAILED DESCRIPTION OF THE PREFERRED EMBODIMENTS

Referring to the sole Figure of the drawing, which shows an Rf coil system according to the invention, it is seen to comprise a first system of coils consisting of two rectangular coils and a second system of coils consisting of five substantially circular coils or, as shown, four circular coils and a coil adapted to an object, in particular suitable for examination of the spinal column. Diagrammatically such a coil system shows a first sYstem of coils 10 consisting of two rectangular coils 12 and 14 which may be of equal width in which, in particular !or imaging the spinal column, coil 14 is wider than coil 12 The coils 12 and 14 have an overlapping area 16 with such a dimension that the coils show a minimum mutual coupling. A second system of coils 20 in this case comprises four substantially circular coils 22, 24, 26, 28 and a coil 30 which is adapted, for example, to the neck, it being noted that the shape of said coils is of no significance for the invention if only they collectively overlap for the greater part an area determined by the first system of coils. These coils also show overlapping areas 32 so that they are mutuallY uncoupled. The overlapping areas 32 in the drawing have the same dimension but in a practical coil this need not be the case with a view in particular to the deviating position which the coils 22 and 30 at the ends of the system occupy. All coils are connected to a control device 38 via coil lines 34 and 36 to which an operating panel 40 is connected or forms part of it. The operating panel comprises buttons 41 having indications A and B corresponding to marks 42 and 44 not further shown and provided in or near the coils 12 and 14 of the first system of coils and buttons 45 with indications 1 to 5 corresponding to marks 46 provided in or near the coils 22 to 30 of the second system of coils 20. By means of the buttons all coils may be actuated individually or in groups, or each of the coil systems as a whole, the latter, for example, also via buttons 47 and 49. A coil system as shown is particularly favorable for the examination of the spinal column. An overall view can be made with the first system of coils the picture quality of which may be not optimum but from which a general information can be obtained and subsequently with the wider coil 14 deeper-situated lower parts of the colon serves can be imaged. Images having a high picture quality can then be made from the sub-regions by means of the system of coils 20 for local diagnostic purposes. Terminal coil, for example, coil 30, of the second system of coils, is in this case given an adapted shape for display of neck vertebrae. Furthermore, terminal coil 30 may be constructed so as to be foldable, i.e. that two sides can be folded up or folded back via a shaft or may be incorporated in a flexible foam bedding.

The marks 46 for the coils or the second system of coils in this case consist of tubes or rods 50 of MR-sensitive material which in the most searched sagittal overall image appear as small dots in the picture and the number of which corresponds to the number of the coil. Similar but also differently shaped marks may be used for the coils of the first system of coils although the need for this is not so urgent.

In addition to a linear coil construction as given here by way of example, a system of coils with several coils in a two-dimensional mutual grouping may also be realized although in that case extra difficulties will occur as regards the combination of a single rough imaging and a good uncoupling.

We claim:

1. A coil system including a plurality of rf surface coils for the detection of magnetic resonance signals excited in an object to be examined, characterized in that the coil system comprises at least two sub-systems of coils, each sub-system comprising a plurality of adjoining rf surface coils, each coil from one sub-system being stacked on top of at least one coil of the other sub-system such that the coils of both sub-systems are in stacked relation, a first of said sub-systems of coils comprising at least two elongate surface coils and a second of said sub-systems which collectively substantially overlap an area comprised by the first sub-system of coils.

2. A coil system as claimed in claim 1, characterized in that the coils of each coil system are mutually uncoupled by mutual overlapping.

3. A coil system as claimed in claim 1, characterized in that at least one of the coils of the second coil system is constructed so as to be adapted to the surface of an object to be measured.

4. A coil system as claimed in claim 1, characterized in that the coils of each coil system are mutually uncoupled by mutual overlapping.

5. A coil system as claimed in claim 1, characterized in that at least one of the coils of the second coil system is constructed so as to be adapted to the surface of an object to be measured.

6. A coil system as claimed in claim 2, characterized in that at least one of the coils of the second coil system is constructed so as to be adapted to the surface of an object to be measured.

7. A coil system as claimed in claim 5, characterized in that the coil adapted to an object to be measured is incorporated in a carrier of a flexible material.

8. A coil system as claimed in claim 6, characterized in that the coil adapted to an object to be measured is incorporated in a carrier of a flexible material.

9. A coil system as claimed in claim 3, characterized in that the coil adapted to an object to be measured is incorporated in a carrier of a flexible material.

10. An Rf coil system having several individually selectable surface coils for magnetic resonance imaging, means for producing a plurality of marks in the image produced from detected magnetic resonance signals, each mark corresponding to an individual coil and means for the selective choice of one or more of the coils including a keyboard having coil selecting keys each corresponding to certain of the coils and in one-to-one correspondence with the marks.

11. A coil system as claimed in claim 10, characterized in that the mark producing means for individual coils in said coil system comprises a predetermined number of elongated elements of an MR-sensitive material.

12. A coil system as claimed in claim 11, characterized in that said mark producing means includes means located adjacent to certain of said coils for producing marks, said marks being oriented so that in the case of sagittal imaging the marks appear as dots in the image.

13. A coil system including a plurality of rf surface coils for the detection of magnetic resonance signals excited in an object to be examined, said coils for generating imaging signals from said detected signals for use in an apparatus for imaging said object, characterized in that the coil system comprises at least two sub-systems of coils, each sub-system comprising a plurality of adjoining rf surface coils, each coil from one sub-system being stacked on top of at least one coil of the other sub-system such that the coils of both sub-systems are in stacked relation, and mans coupled to both sub-systems for correlating a position in an image produced from the imaging signals from the one sub-system to a coil of the other sub-system.

14. The system of claim 13, wherein certain of the coils of the one sub-system are larger in area of coverage than the coils of the other sub-system.

15. The system of claim 14 wherein at least one coil of the one system is rectangular and a plurality of the coils of the other system are circular.

16. The system of claim 15, wherein the at least one rectangular coil overlaps at lest two of of the coils of the other sub-system.

* * * * *